(12) United States Patent
Kim

(10) Patent No.: US 6,808,978 B2
(45) Date of Patent: Oct. 26, 2004

(54) METHOD FOR FABRICATING METAL ELECTRODE WITH ATOMIC LAYER DEPOSITION (ALD) IN SEMICONDUCTOR DEVICE

(75) Inventor: Younsoo Kim, Ichon-shi (KR)

(73) Assignee: Hynix Semiconductor Inc., Ichon-shi (KR)

(*) Notice: Subject to any disclaimer, the term of this patent is extended or adjusted under 35 U.S.C. 154(b) by 0 days.

(21) Appl. No.: 10/330,436

(22) Filed: Dec. 30, 2002

(65) Prior Publication Data

US 2003/0201541 A1 Oct. 30, 2003

(30) Foreign Application Priority Data

Apr. 26, 2002 (KR) ......................................... 2002-23022

(51) Int. Cl.[7] ...................... H01L 21/8242; H01L 21/20
(52) U.S. Cl. ........................ 438/239; 438/253; 438/386; 438/396
(58) Field of Search ................................. 438/238, 239, 438/386, 387, 244, 253, 396

(56) References Cited

U.S. PATENT DOCUMENTS 6,482,740 B2 * 11/2002 Soininen et al. ............ 438/686
6,527,855 B2 * 3/2003 DelaRosa et al. .............. 117/89

* cited by examiner

*Primary Examiner*—Hung Vu
(74) *Attorney, Agent, or Firm*—Jacobson Holman PLLC

(57) ABSTRACT

A method for fabricating a semiconductor memory device, includes the steps of loading a substrate into a reaction chamber for an atomic layer deposition, injecting an precursor consisting of M and X into the reaction chamber and including an adsorption precursor onto a surface of the substrate, wherein M is one of nickel (Ni), palladium (Pd) and platinum (Pt) and X is ligand, purging the reaction chamber, injecting a reaction gas into the reaction chamber and forming a metal layer by reacting the precursor adsorbed on the surface of the substrate with the, reaction gas and purging the reaction chamber.

7 Claims, 2 Drawing Sheets

METHOD FOR FABRICATING METAL ELECTRODE WITH ATOMIC LAYER DEPOSITION (ALD) IN SEMICONDUCTOR DEVICE

FIELD OF THE INVENTION

The present invention relates to a method for fabricating a metal electrode in a semiconductor device; and, more particularly, to a method for fabricating a metal electrode of nickel (Ni), palladium (Pd) or platinum (Pt) with an atomic layer deposition (ALD) technique.

DESCRIPTION OF RELATED ART

When fabricating a metal electrode by using nickel, palladium or platinum according to the prior art, the metal electrode is formed by a chemical vapor deposition (CVD) technique using a precursor, of which an oxidation state is of +2 or +4, and a reactive gas, such as a hydrogen gas or the like.

Generally, the CVD technique is employed for depositing a film on an exposed surface of a substrate, such as a silicon wafer or the like, and the precursor used at the CVD is a thermo-decomposable and volatile compound. The precursor is contacted on a substrate heated over a decomposition temperature of the precursor. A film composed of metal, metal compound, metal alloy, ceramic, metal oxide and a mixture thereof is formed on a substrate, which depends on selection of precursor and reaction conditions.

A method for fabricating a metal electrode of nickel, palladium or platinum by using CVD, hereinafter, will be described.

When the metal electrode is formed by CVD, a precursor ($MX_2$ or $MX_4$), of which an oxidation state is of +2 or +4, and a reaction gas, such as an oxygen gas, a hydrogen gas or the like, are used. In the precursor $MX_2$ or $MX_4$, M is one of nickel, palladium and platinum and X is an anionic ligand.

When the oxygen gas is used as the reaction gas, the oxygen gas reduces an oxidized metal precursor by a reaction with the metal precursor and reacts with the anionic ligand X to generate by-products. The ligand is a material selected from the group consisting of $H_2$, Cl, Br, I, $C_1$~$C_{10}$ alkyl, $C_2$~$C_{10}$ alkenyl, $C_1$~$C_8$ alkoxy, $C_6$~$C_{12}$ aryl, β-diketonates, cyclopentadienyl, $C_1$~$C_8$ alkylcyclopentadienyl and derivatives thereof including halogens therein. Neutral products among the reaction products, which are produced through oxidation and reduction reaction between the oxygen gas and the metal precursor, may be removed with a vacuum pump. However, since it is very difficult to remove the anionic and cationic products, they may be left in the metal electrode as impurities.

Also, The reaction of oxygen and the ligand is not only complex, but also rapidly performed, so that impurities such carbon, hydrogen and oxygen remain in the metal electrode. The remaining impurities are diffused at a post-thermal process so that a characteristic of the metal electrode is degraded.

To solve the above problem, in case of using hydrogen, which is a reductive gas, as a reaction gas, the metal electrode precursor previously undergoes decomposition and then a carbonate is produced so that impurities still remain in the metal electrode because a deposition temperature has to be set over 700° in order to activate the hydrogen.

When the metal electrode is used as an top electrode of a capacitor with dielectric layers such as $Ta_2O_5$, $(Bi,La)_4Ti_3O_{12}$ (BLT), $SrBi_2Ta_2O_9$ (SBT), $Sr_xBi_y(Ta_iNb_j)_2O_9$ (SBTN), $Ba_xSr_{(1-x)}TiO_3$ (BST), $Pb(Zr,Ti)O_3$ (PZT) and the like, if the $H_2$ gas is supplied at a high temperature as a reaction gas, $H_2$ reduces the dielectric oxide layer so that the desired electrical characteristics cannot be obtained.

Furthermore, when the metal electrode is formed with nickel, palladium or platinum by using CVD, since the metal precursor of a gas state and the reaction gas are simultaneously supplied into the reaction chamber, a decomposition reaction occurs between the reaction gas and the metal precursor. Non-volatile materials, such as carbonate, oxide and the like, are also produced by the above reaction. These non-volatile materials exist in the metal electrode and cause generation of particles, which induce an operation failure.

When a nickel metal electrode is formed by CVD, sizes of nickel particles are about 0.1 □ to 1.0 □. If the particles having a size of about 0.1 □ to 1.0 □ stick to the dielectric layer formed to a thickness of about 0.03 □, a serious problem is caused for a step coverage characteristic of the dielectric layer and a dielectric characteristic is deteriorated. In case of a memory device, since an operation failure of a memory cell having these particles is caused, so that the yield is decreased.

SUMMARY OF THE INVENTION

It is, therefore, an object of the present invention to provide a method for fabricating a metal electrode capable of removing impurities and particles therein by using an atomic layer deposition (ALD) technique.

In accordance with an aspect of the present invention, there is provided a method for fabricating a semiconductor memory device, comprising the steps of: loading a substrate into a reaction chamber for an atomic layer deposition; injecting an precursor consisting of M and X into the reaction chamber and including an adsorption precursor onto a surface of the substrate, wherein M is one of nickel (Ni), palladium (Pd) and platinum (Pt) and X is ligand,; purging the reaction chamber; injecting a reaction gas into the reaction chamber and forming a metal layer by,reacting the precursor adsorbed on the surface of the substrate with the reaction gas; and purging the reaction chamber.

In accordance with another aspect of the present invention, there is provided a semiconductor memory device comprising: a substrate: and a metal layer formed on the substrate by using an atomic layer deposition, wherein the metal layer is formed by reacting a precursor consisting of M and X with a reaction gas on a surface of the substrate, wherein M is one of nickel (Ni), palladium (Pd) and platinum (pt), and X is ligand.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, a method for fabricating a metal electrode by using an atomic layer deposition (ALD) technique of a capacitor in accordance with the present invention will be described in detail referring to the accompanying drawings.

Figure 1A:
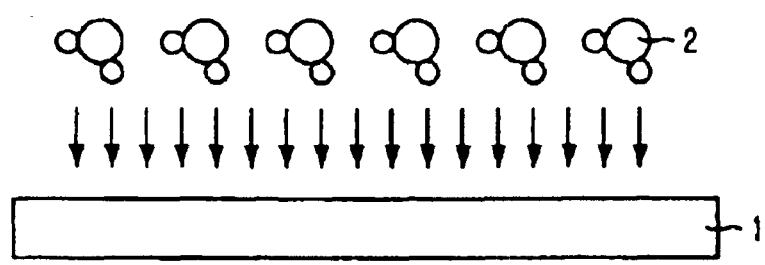
FIGS. 1A to 1C are cross-sectional views illustrating an atomic layer deposition (ALD) technique of a metal electrode in accordance with the preferred embodiment of the present invention.
Figure 1B:
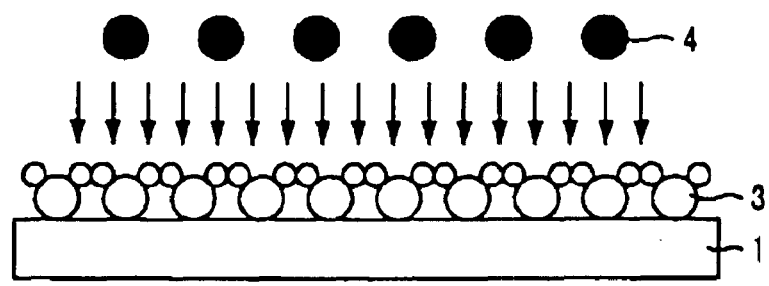
Figure 1C:
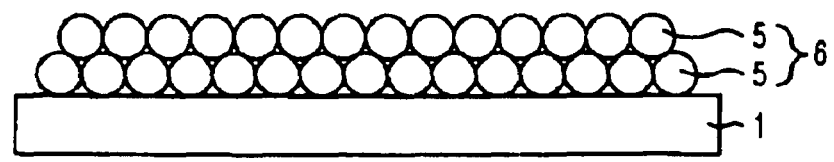

FIGS. 1A to 1C are cross-sectional views illustrating an atomic layer deposition (ALD) technique of a metal electrode in accordance with the preferred embodiment of the present invention.

Hydrazine ($N_2H_4$) used as a reaction gas in accordance with the preferred embodiment of the present invention forms a layer for a metal electrode and neutral by-products such as HX, $NH_3$ and $N_2$. Since the by-products have a high volatility, they can be easily removed by using a vacuum pump.

Hydrazine is a compound of nitrogen and hydrogen. Hydrazine smokes in air and is a transparent liquid. Also, hydrazine smells like ammonia and has a melting point, boiling point and specific gravity of 2·, 113.5· and 1.011, respectively.

The reaction between the metal precursor, of which oxidation state is +2 and the hydrazine is as a following equation 1:

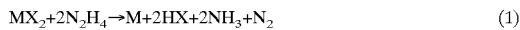

$$MX_2 + 2N_2H_4 \rightarrow M + 2HX + 2NH_3 + N_2 \quad (1)$$

Herein, M is the metal selected from a group consisting of one of nickel, palladium and platinum, and X is the ligand selected from the group consisting of H, F, Cl, Br, I, $C_1$~$C_{10}$ alkyl, $C_2$~$C_{10}$ alkenyl, $C_1$~$C_8$ alkoxy, $C_6$~$C_{12}$ aryl, diketonates, cyclopentaienyl, $C_1$~$C_8$ alkylcyclopentadienyl and derivatives thereof including halogens therein.

As mentioned above equation 1, a layer consisting of the metal (M) is deposited by the reaction of hydrazine $N_2H_4$ and the metal precursor ($MX_2$) and some reaction products (HX, $2NH_3$, $N_2$) having a high volatility are produced. At this time, HX, which is a compound of the hydrogen and ligand, can be easily removed by a vacuum pump.

In the preferred embodiment, when a layer for metal electrode is deposited according to the above equation 1 with an atomic layer deposition (ALD) technique. A reaction can be controlled more easily in a molecular level by the ALD technique compared to a CVD technique.

Generally, one period for forming a layer for metal electrode with ALD is follows. A source gas is supplied to a chamber for the ALD and one layer of the source gas is chemically adsorbed onto a surface of a substrate. Thereafter, a non-reacted source gas, which is physically adsorbed, is purged by providing a purge gas. Subsequently, a reaction gas is injected into the chamber to reaction with the layer of source adsorbed onto the surface of the substrate, so that a desired layer is deposited and the remaining reaction gas is removed by proving a purge gas. Thus, one period is completed.

As described in the above, the ALD technique uses a surface reaction mechanism so that a stable and uniform thin layer can be acquired. Also, because the source gas and the reaction gas are separately and sequentially injected and purged, particle production, which is caused by a gas phase reaction, can be suppressed.

FIGS. 1A to 1C are cross-sectional views illustrating the metal electrode deposition by using the ALD technique in accordance with the preferred embodiment of the present invention.

As shown in FIG. 1A, a substrate 1, which the metal electrode will be deposited, is loaded into a reaction chamber (not shown) and the substrate 1 is preheated to a temperature ranging from about 100· to 700·. When the hydrazine is used as the reaction gas, a reaction can be activated below temperature of about 500·. Therefore, in case of applying the metal, the method in accordance with the present invention to for a top electrode formed on the dielectric layer of a capacitor, reduction of the dielectric layer is prevented so that a characteristic of the dielectric layer can be maintained.

After preheating the substrate 1, the vaporized metal precursor 2, i.e., a source gas, is injected into the reaction chamber with a carrier gas such as Ar, $N_2$ or the like, so that the metal precursor 2 is adsorbed on a surface of the preheated substrate 1. Subsequently, the injection of the metal precursor gas is stopped and a purge gas, such as $N_2$, He, Ar or a mixture gas thereof, is injected into the chamber, and by-products, such as a non-adsorbed metal precursor and the like, are removed by using a vacuum pump.

As shown in FIG. 1B, hydrazine 4, which is a reaction gas, is injected and reacted with the metal precursor 3 adsorbed on the surface of the substrate 1, so that a metal layer 5 is formed. At this time, by-products, such as HX, $NH_3$ and $N_2$, are produced as shown in equation 1.

In accordance with the preferred embodiment of the present invention, hydrazine ($N_2H_4$), $NR_3$, $C_1$~$C_{10}$ alkylhydrazine, $C_1$~$C_{10}$ dialkylhydrazine, $NH_3$, $NH_2R$, $NHR_2$ or a mixture gas thereof is used as the reaction gas. Herein, "R" denotes a material selected from the group consisting of hydrogen, $C_1$~$C_{10}$ alkyl, $C_2$~$C_{10}$ alkenyl, $C_1$~$C_8$ alkoxy, $C_6$~$C_{12}$ aryl and derivatives including elements of halogen group therein.

Next, the reaction gas injection is stopped, and a purge gas, such as $N_2$, He, Ar or a mixture gas thereof, is injected into the chamber to remove the reaction by-products (HX, $NH_3$, $N_2$) and a non-reacted reaction gas.

The above procedure as one cycle is repeatedly carried out so that the metal electrode 6 consisting of a number of the metal layer 5 is obtained as shown in FIG. 1C.

Figure 2:
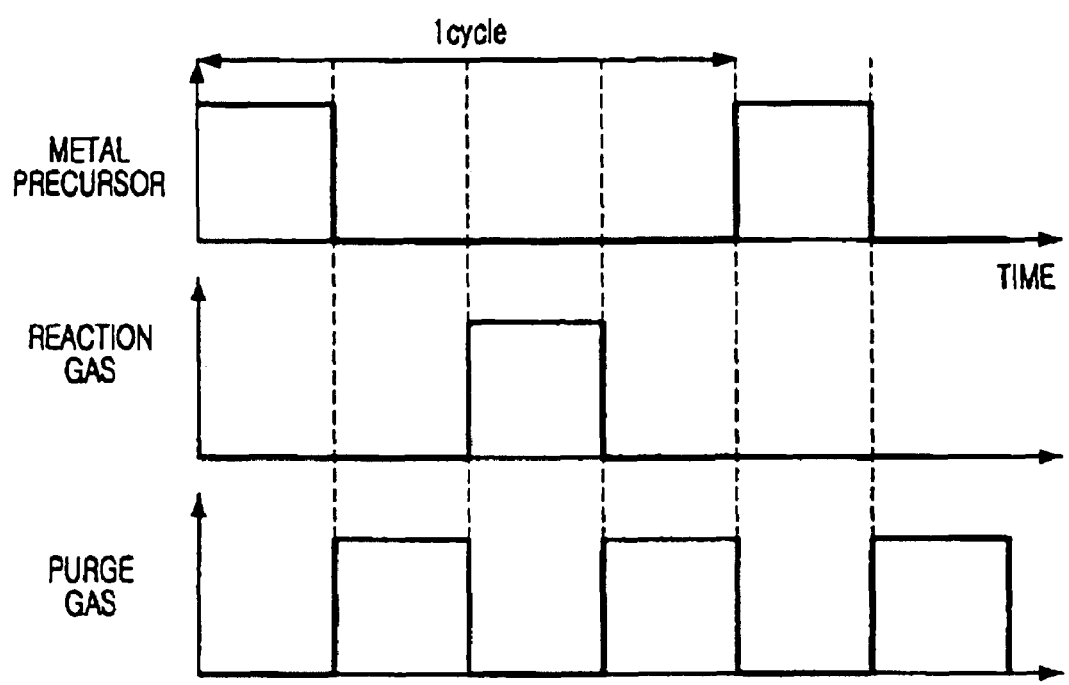
FIG. 2 is a diagram illustrating a sequential injection cycle of a metal precursor, the reaction gas and the purge gas in accordance with the preferred embodiment of the present invention.

FIG. 2 is a diagram illustrating each injection cycle of the metal precursor, the reaction gas and the purge gas according to the deposition time. One cycle consists sequential injections of the metal precursor, the purge gas, the reaction gas and the purge gas. As the cycles are repeatedly performed, the metal electrode can be formed to a desired thickness.

The metal electrode of nickel, palladium or platinum formed by the above ALD technique may be applied to a gate electrode, bit line or an electrode of a capacitor in a semiconductor memory device.

As the method fabricating the metal electrode in accordance with the preferred embodiment of the present invention is applied, impurities in the metal electrode can be minimized. As shown in equation 1, since the by-products produced by the reaction between the metal precursor and the reaction gas are neutral products having a high evaporation pressure, by-reaction products can be easily removed from the reaction chamber by a vacuum pump. Therefore, impurities are not nearly left in the metal electrode.

In the conventional chemical vapor deposition technique, the reaction gas and the metal precursor, are reacted so that non-volatile reaction products are produced. However, the reaction between the reaction gas and the precursor is performed only on the surface of the substrate according to the present invention so that particles are not produced.

Accordingly, when the metal electrode of nickel, palladium or platinum is formed in accordance with present invention, a pure metal electrode can be obtained and a problem due to particle generation can be solved, so that reliability and yield of the device can be increased.

While the present invention has been described with respect to the particular embodiments, it will be apparent to those skilled in the art that various changes and modifications may be made without departing from the spirit and scope of the invention as defined in the following claims.

What is claimed is:

1. A method for fabricating a semiconductor memory device, comprising the steps of:

loading a substrate into a reaction chamber for an atomic layer deposition;

injecting a precursor consisting of M and X into the reaction chamber and including an adsorption precursor onto a surface of the substrate, wherein M is one of nickel (Ni), palladium (Pd) and platinum (Pt) and X is ligand;

purging the reaction chamber;

injecting a reaction gas into the reaction chamber and forming a metal layer by reacting the precursor adsorbed on the surface of the substrate with the reaction gas, wherein the reaction gas is a gas selected from the group consisting of $NH_3$, hidrazine, $C_1$~$C_{10}$ alkylhydrazine, $C_1$~$C_{10}$ dialkylhydrazine and a mixture gas thereof; and purging the reaction chamber.

2. The method as recited in claim 1, wherein the precursor is $MX_2$ or $MX_4$.

3. The method as recited in claim 2, further comprising the step of preheating the substrate at a temperature of about 100° C. to 700° C. before injecting the precursor.

4. The method as recited in claim 2, wherein the ligand is a material selected from the group consisting of $H_2$, Cl, Br, I, $C_1$~$C_{10}$ alkyl, $C_2$~$C_{10}$ alkenyl, $C_1$~$C_8$ alkoxy, $C_6$~$C_{12}$ aryl, β-diketonates, cyclopentadienyl, $C_1$~$C_8$ alkylcyclopentadienyl and derivatives thereof including halogens therein.

5. The method as recited in claim 2, wherein a purge gas selected from a group consisting of $N_2$, He, Ne, Ar and a mixture gas thereof is injected at the step of purging the reaction chamber.

6. The method as recited in claim 2, wherein an Ar gas or an $N_2$ gas is used as a carrier gas at the step of injecting the precursor for carrying the precursor into the reaction chamber.

7. The method as recited in claim 2, wherein the metal layer is one of a gate electrode, bitline and an electrode of a capacitor.

* * * * *